Figure 1:
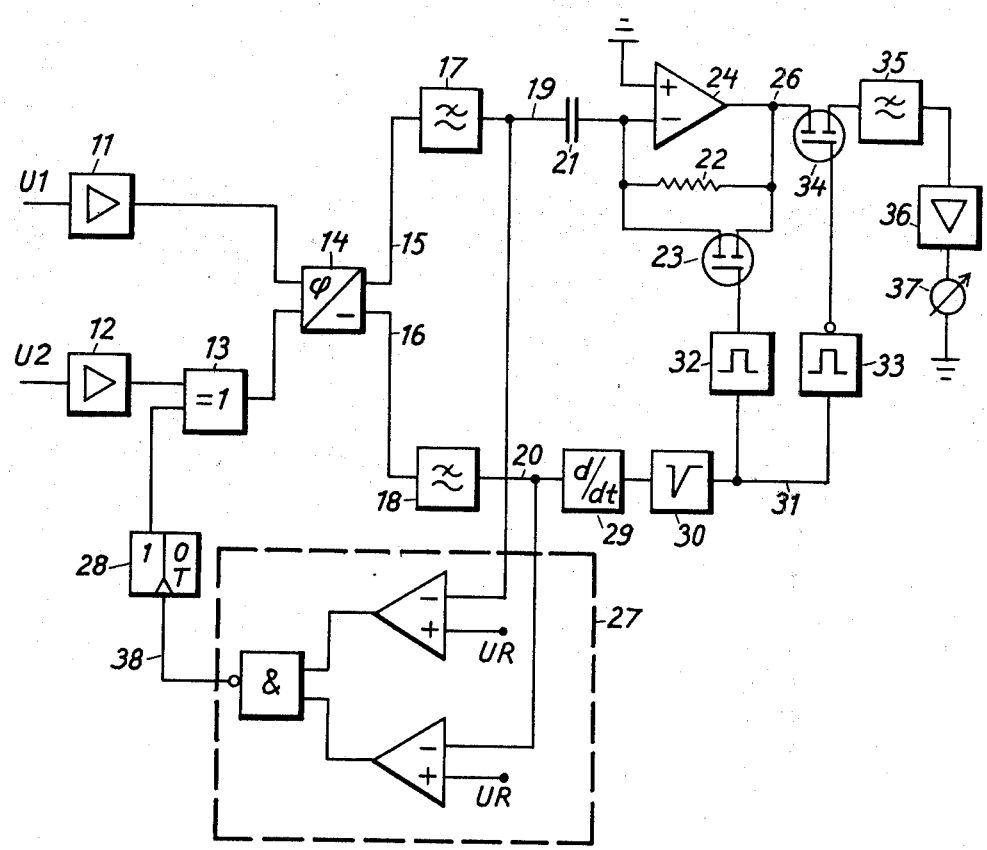

United States Patent [19]

Bylund et al.

[11] 4,001,680
[45] Jan. 4, 1977

[54] DEVICE FOR MEASURING SMALL FREQUENCY DIFFERENCIES

[75] Inventors: Per Gunnar Bylund, Spanga; Bertil Lyberg, Norsborg, both of Sweden

[73] Assignee: Telefonaktiebolaget L M Ericsson, Stockholm, Sweden

[22] Filed: Jan. 7, 1976

[21] Appl. No.: 647,173

[30] Foreign Application Priority Data

Jan. 29, 1975 Sweden .............................. 7500935

[52] U.S. Cl. .............. 324/78 Z; 328/133; 324/83 FE
[51] Int. Cl.[2] ...................................... G01R 23/02
[58] Field of Search .......... 324/78 R, 78 Z, 79 R, 324/83 FE, 140 R; 328/127, 133, 134

[56] References Cited

UNITED STATES PATENTS

| 3,233,180 | 2/1966 | Eddy | 324/79 R |
| 3,515,997 | 6/1970 | Babany | 324/79 R |
| 3,519,929 | 7/1970 | Ault | 324/79 R |

*Primary Examiner*—Robert Segal
*Assistant Examiner*—Michael J. Tokar
*Attorney, Agent, or Firm*—Hane, Sullivan & Spiecens

[57] ABSTRACT

A device for measuring small frequency differencies includes a phase detector followed by a differentiating circuit. In order to linearize the output from the differentiating circuit the time constant thereof is decreased during the fly back time of the saw-tooth wave delivered by the phase detector and the phase of one of the frequencies is shifted 180° as soon as the saw-tooth approaches the generally non-linear end portion.

7 Claims, 9 Drawing Figures

DEVICE FOR MEASURING SMALL FREQUENCY DIFFERENCIES

The present invention relates to a device for measuring small frequency differencies.

In a telecommunication system of the carrier frequency type it is a known problem to synchronize the main oscillators from which the different channel frequency signals are deduced. With the large number of channels existing in modern carrier frequency systems it is necessary that different main oscillators included in a system have the frequency signals synchronized within very narrow limits. It is desirable to be able to measure the frequency differencies in the order of magnitude of mHz at absolute frequencies in the order of magnitude of some MHz.

A common method for measuring frequency differencies is to monitor the beat frequency, for instance on a meter. Due to the fact that the deviation of the pointer of the meter takes a long time one single reading takes several minutes. The time required for one oscillator setting, which normally demands several readings, can be tens of minutes. It is known, for example through the U.S. Pat. Nos. 3,235,800 and 3,519,928 to sense a small frequency deviation by measuring the phase difference between a normal frequency and the measuring frequency in a phase discriminator. After filtering in a low-pass filter, a linearly increasing voltage ramp is obtained having a slope which is proportional to the frequency difference. This linear voltage ramp differentiated whereby a direct voltage which is proportional to the frequency difference is obtained. The direct voltage can, for instance, control a pointer instrument which can be calibrated directly in frequency difference. A frequency difference meter of this kind permits a considerably quicker reading than earlier known methods. The ramp is not infinite but has a fly back transient each time the phase difference between the voltages passes through $2\pi$. The voltage generated at the derivation of the fly back influences the measuring value. Furthermore it is difficult to get a ramp voltage that is linear over its entire range, something which results in errors in the differentiated voltage. In order to avoid these disadvantages two different measuring arrangements with a phase detector and differentiating circuits have been arranged in the known frequency difference meters. One of the voltages that is brought to one of these measuring arrangements is phase shifted 180° that the outputs of the two phase detectors also will be phase shifted 180°. The non-linear parts of the output voltage obtained from the differentiating circuit consequently appear phase shifted 180° too. By alternatively connecting the measuring circuit to the two differentiating circuits it is possible all the time to provide the measuring circuit with a voltage which has been obtained by differentiating a linear section of the ramp. The disadvantage of this arrangement is that the circuits turn out to be complicated as well as expensive. The known frequency difference meters are moreover sensitive to transients, for example phase jumps in the signals to be measured.

According to the invention it is possible to obtain the same result with a considerably simpler arrangement. The characteristics of the invention appear from the appended claims.

The invention will be described more in detail with reference to the appended drawings where FIG. 1 shows a block diagram of a frequency difference meter according to the invention and FIGS. 2A through 2H shows a number of pulse waveform diagrams.

In FIG. 1 the frequency difference between two alternating voltages U1 and U2 having the frequencies $f1$ and $f2$ is to be measured. In a typical embodiment both frequencies $f1$ and $f2$ have the order of magnitude MHz while the frequency difference is in the order of magnitude mHz. The input signals U1 and U2 are amplified and converted to square waves in the amplifiers 11 and 12. The output of the amplifier 11 is directly connected to an input of the phase detector 14 while the output of the amplifier 12 is connected to one of the inputs of an EXCLUSIVE-OR circuit 13 the output of which is connected to the second input of the phase detector 14. The EXCLUSIVE-OR circuit 13, the second input of which is connected to a control flip-flop circuit 28, works as a phase shifter which shifts the phase 180° of the signal U2 which is applied to the phase detector 14, each time the flip-flop 28 changes its state. The phase detector has two outputs 15 and 16 for complementary signals. A low-pass filter 17 is connected to the output 15 and a low-pass filter 18 is connected to the output 16 in order to attenuate the high-frequency components in the outputs of the phase detector. Therefore the signals at the points 19 and 20 have the shape of complementary ramps according to FIG. 2A and 2B.

A differentiating circuit of a known type is connected to point 19 the circuit consists of a series capacitor 21 and an operational amplifier 24 having a feed-back resistor 22. The resistor 22 is connected in parallel with a field effect transistor 23 working as an electronically controlled switch. The output 26 of differentiating circuit is connected to a measuring instrument 37 via a second electronically controlled switch 34, a low-pass filter 35 and an amplifier 36.

The output 20 of the filter 18 is connected via a differentiating circuit 29 to a polarity determining circuit 30 which always gives a negative pulse to the point 31 irrespective of whether the voltage at the point 20 is increasing or decreasing. The output 31 of the circuit 30 is connected to the trigger inputs of two monostable flip-flop circuits 32 and 33 where the flip-flop circuit 32 controls the switch 23 while the flip-flop circuit 33 controls the switch 34.

The points 19 and 20 are connected to the inputs of a level detector 27 the output 38 of which goes low only if the voltage at both the points 19 and 20 is above a certain level determined by the reference voltage UR. The output 38 is connected to the bistable flip-flop circuit 28 which is triggered each time the output signal of the output 38 goes from a low to a high level.

The operation of the device will be described using the waveforms shown in FIG. 2.

In the beginning it is assumed that the level sensing circuit 27 is disconnected and that the voltage U1 has the highest frequency. The output voltage at point 19 then will vary according to a ramp 19' as is shown in FIG. 2A. The instantaneous amplitude of the ramp is proportional to the phase difference between the voltages and its slope consequently becomes proportional to the frequency difference. By differentiating the ramp 19' in the differentiating circuit 21, 22 24 a direct voltage is obtained that is proportional to the frequency difference.

The ramp 19' is a periodic function which jumps (has a discontinuity) each time the phase difference between U1 and U2 passes $2\pi$. Consequently a considerable jump is also obtained in the derivative of the slope and such jump disturbs the measuring results. Furthermore, the ramp is non-linear both before and after the voltage jump due to inaccuracies in the phase detection partly depending on the fact that the rise and fall times of the input square waves cannot be neglected. In a typical circuit for measuring frequency differencies being about 10 mHz (period time 100 seconds) it has been found that the non-linearity of the circuit caused an incorrect output level from the differentiating circuit during about 5 seconds at each jump of the ramp. The jump itself in the direct voltage level furthermore caused the differentiating circuit to be blocked since the operational amplifier was saturated during about 10 seconds. This interval is determined by the time for discharging the capacitor 21. The discharge current flows through the resistor 22 which in a typical case was 2MΩ when having a capacitance value of 10 μF.

By momentarily shunting the resistor 22 with a considerably lower resistance the blocking interval of the differentiation circuit can be considerably reduced. This is effectuated by means of the field effect transistor 23 which has a lead resistance in the order of magnitude of 400Ω while the cut off resistance is so high that it can be neglected in comparison with the resistance of resistor 22. The field effect transistor is made conducting by means of a pulse from the monostable flip-flop 32 being controlled by a pulse which is derived from the voltage jump of the ramp by means of the differentiating circuit 29 and the rectifying circuit 30. The duration of the pulse 32 (FIG. 2F) is chosen in such a way that there is time to discharge the capacitor 30. In order to prevent the low-pass filter 35 at the output of the differentiating circuit from being discharged backwards through the transistor 23 when this is conducting the field effect transistor 34 is provided. Transistor 34 is made non-conducting during the time the transistor 23 is conducting or during a somewhat longer period by means of the pulses from the monostable flip-flop 33 (FIG. 2G) which is triggered by the same pulse as the monostable flip-flop 32.

Figure 2:
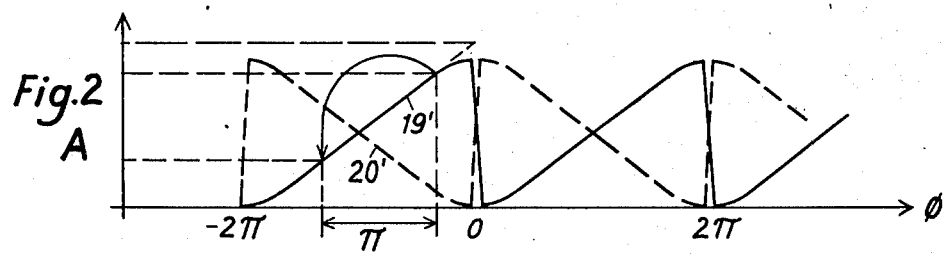
Figure 2:
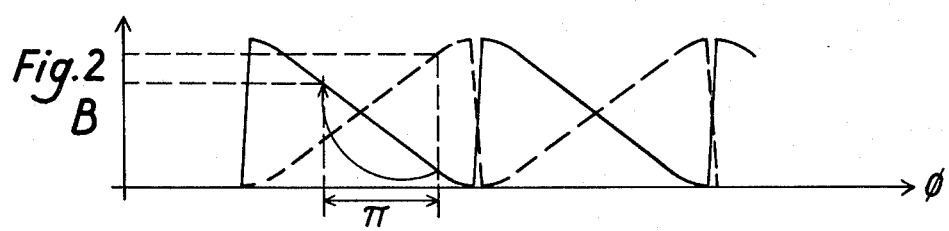
Figure 2:
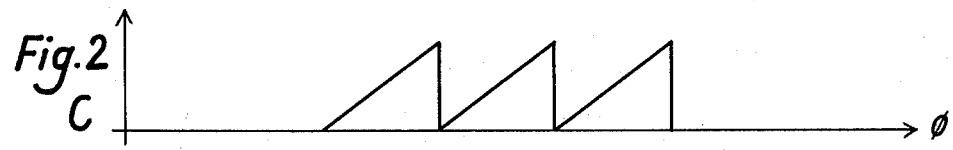
Figure 2:
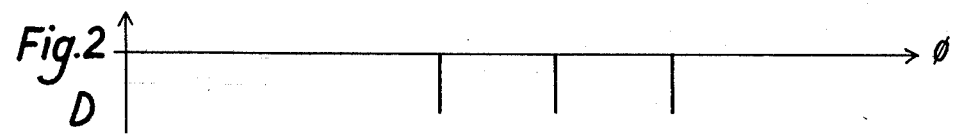
Figure 2:
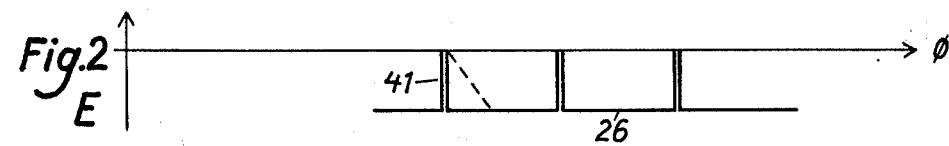
Figure 2:
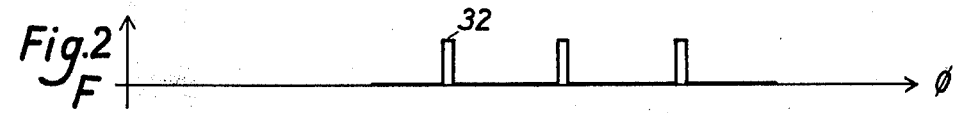
Figure 2:
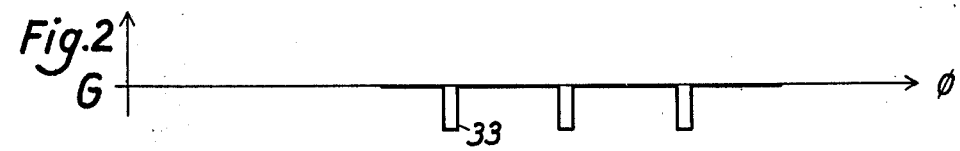
Figure 2:
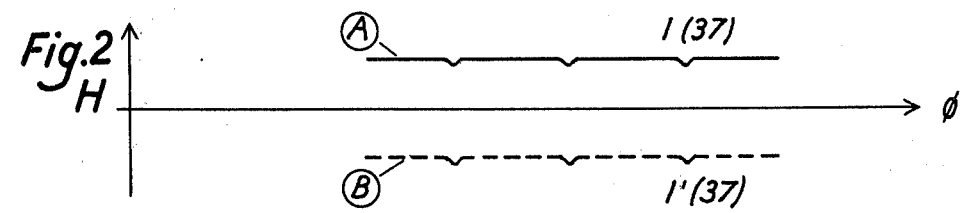

The short interruption of the signal of the input to the low-pass filter 35 is almost totally equalized by this filter because the amplifier 36 constitutes a negligible load impedance and the direct current flowing through the meter 37 will be a practically pure direct current as appears from FIG. 2 H.

This momentaneous reduction of the time constant of the derivating circuit and disconnection of the low-pass filter 35 is of course effective also when other transients appear for example phase jumps in any of the input signals.

In the described example the instrument makes a positive deflection according to the curve A of FIG. 2 H. If frequency f1 is smaller than frequency f2 the ramp of the descriminator will have a reverse slope according to 19'' in FIG. 2B and consequently the derivative is negative and the deflection of the meter goes in a negative direction according to the curve B of FIG. 2 H.

In order to overcome the non-linearities at the ends of the ramp, the level in the points 19 and 20 is sensed by means of the level detector 27 and these levels are compared to a reference voltage UR. Voltage UR corresponds to the upper level where the ramp is non-linear. As long as both points 19 and 20 have a lower level than UR the output 38 has a low level. As soon as one of these points 19, 20 exceeds the level of voltage UR (19 at a positive and 20 at a negative slope), the slope of the ramp referring to point 19, the output 38 goes high and the flip-flop circuit, working as a flank-triggered T-flip-flop, switches and changes the level on one of the inputs of the EXCLUSIVE-OR circuit 13. This means that the output of the EXCLUSIVE-OR circuit will be high for pulses having a polarity that is opposite to the polarity that made the output high before the flip-flop circuit 28 switched. That is why the output signal from the amplifier 12 is phase shifted 180° each time the flip-flop circuit 28 switches. Thus the momentary amplitude of the ramp voltage is brought back from its value UR to the value UR−UT/2 where UT is the crest value of the ramp voltage. Then the voltage increases again along the linear part of the ramp until the level UR is reached whereby the voltage is brought back by means of a jump to the level UR1−UT/2 etc.

Since only half the ramp is utilized while the slope is unchanged the frequency of the saw-tooth wave form generated is doubled, as appears from FIG. 2C.

When frequency $f1 >$ frequency $f2$ the ramp appearing at the point 19 has a positive slope as appears from FIG. 2A. In this case the level is sensed in the point 19. When $f1 < f2$ the ramp is falling and in this case the level is sensed in the point 20 (the dashed curve). The level in the point 19 is then brought back according to FIG. 2B from the level UT−UR to the level (3UT/2) − UR and the falling ramp is starting again.

The invention is not limited to the shown embodiment but can be modified within the scope of the invention. The schematically shown level detector and differentiating means can of course be replaced by other circuits having an equivalent function.

We claim:

1. A device for measuring small frequency differencies of the kind where the AC voltages, the frequency difference of which is to be measured, are squared and applied to a phase detector, the output signal of which is a ramp voltage having an amplitude proportional to the phase difference, said ramp voltage being differentiated in a differentiating circuit to get a DC voltage proportional to the frequency difference, characterized by means for decreasing the time constant of the differentiating circuit during any transient change in the linear ramp voltage, by switch means connected between the output of the differentiating circuit and a following low-pass filter said switch being arranged to disconnect the low-pass filter from the differentiating circuit during the time the latter has a decreased time constant, and by a phase shifter connected before one of the inputs of the phase detector for shifting the phase of the corresponding AC voltage 180° as soon as the ramp voltage amplitude falls outside the linear range of the ramp.

2. A device as claimed in claim 1, where the differentiating circuit comprises an operational amplifier having a capacitor connected in series with one of the inputs and a high feed back resistor between the output and said input, and further comprising a second switch for connecting a shunt means having a low resistance across said feed back resistor.

3. A device as claimed in claim 2, characterized by a pulse generator for generating pulses by differentiating transients in the ramp voltage, monostable flip-flops connected to said pulse generators and controlled by a pulse obtained by differentiating the transient of the ramp voltage, said monostable flip-flops sending one pulse for opening said first switch and one pulse for closing said second switch mainly during the transient.

4. A device as claimed in claim 3, characterized therein that the output pulse of the monostable flip-flop controlling said first switch has a longer duration than that of the monostable flip-flop controlling the second switch.

5. A device as claimed in claim 2, characterized in that said switches are field effect transistors.

6. A device as claimed in claim 5, characterized in that the resistance of said shunt is the lead resistance of the second switch.

7. A device as claimed in claim 1, characterized therein that the phase shifter is an EXCLUSIVE-OR circuit having one input connected to said one AC voltage and another input, a bistable flip-flop connected to the other input and a level sensing circuit for controlling said bistable flip-flop to switch each time the ramp voltage falls outside the linear range.

* * * * *